(12) United States Patent
Young et al.

(10) Patent No.: US 6,172,541 B1
(45) Date of Patent: Jan. 9, 2001

(54) DRIVER CIRCUIT HAVING LOAD-INDEPENDENT SLEW RATE

(75) Inventors: William R. Young, Palm Bay, FL (US); Stuart W. Pullen, Raleigh, NC (US)

(73) Assignee: Intersil Corporation, Palm Bay, FL (US)

( * ) Notice: Under 35 U.S.C. 154(b), the term of this patent shall be extended for 0 days.

(21) Appl. No.: 09/152,420

(22) Filed: Sep. 14, 1998

(51) Int. Cl.[7] .................................................. H03K 5/12
(52) U.S. Cl. ................................ 327/170; 327/23; 327/27
(58) Field of Search .................................. 327/170, 175, 327/427, 437; 326/23, 24, 27

(56) References Cited

U.S. PATENT DOCUMENTS

| | | | |
|---|---|---|---|
| 3,996,482 | 12/1976 | Lockwood | 327/172 |
| 4,471,245 | 9/1984 | Janutka | 327/376 |
| 5,258,662 | 11/1993 | Skovmand | 327/544 |
| 5,477,180 | * 12/1995 | Chen | 327/175 |
| 5,534,814 | 7/1996 | Archer | 327/427 |
| 5,742,193 | * 4/1998 | Colli et al. | 327/170 |
| 5,828,245 | * 10/1998 | Brambilla et al. | 327/108 |
| 5,939,909 | * 8/1999 | Callahan, Jr. | 327/108 |

* cited by examiner

Primary Examiner—Timothy P. Callahan
Assistant Examiner—Hai L. Nguyen
(74) Attorney, Agent, or Firm—Allen, Dyer, Doppelt, Milbrath & Gilchrist, P.A.

(57) ABSTRACT

Load-monitoring feedback is used to maintain the slew rate of a line driver circuit at a prescribed rate that is independent of the effective load of the line being driven. This load-monitoring feedback control makes it possible to drive the line with an amplified output signal that faithfully tracks the input signal and conforms with prescribed slew rate and rise/fall time specifications, irrespective of characteristics of the signal line, which may vary over a specified range of component values. In a first embodiment, slew rate control is effected by increasing or decreasing the amount of charge on a reference capacitor and thereby the drive current to an output driver FET, in accordance with the change in state of the output of an output terminal-monitoring voltage threshold comparator relative to termination of a prescribed (one-shot established) time window. In a second embodiment, slew rate control is effected by directly determining the length of time required for the output terminal to transition between first and second states, and adjusting the operation of the output driver FET based on whether the total time measurement is equal to, greater than or less than the slew rate window.

7 Claims, 2 Drawing Sheets

DRIVER CIRCUIT HAVING LOAD-INDEPENDENT SLEW RATE

FIELD OF THE INVENTION

The present invention relates in general to communication circuits, and is particularly directed to a driver circuit that may be used for driving a load, such as a digital communication line, in accordance with data transitions in an input signal, so that the amplified output signal driving the line conforms with prescribed slew rate and rise/fall time specifications, irrespective of characteristics (e.g., capacitance) of the line being driven.

BACKGROUND OF THE INVENTION

Suppliers of digital communication circuits, such as those employed for transmitting digital data, including, but not limited to an RS-232 formatted digital data stream, must conform with user specifications that define maximum and minimum limits on slew rate, as well a rise and fall time boundaries of signal transitions in the transmitted data. Unfortunately, the characteristics (especially capacitance) of the loads (lines) to which such digital data transmission equipment may be connected can be expected to vary from line to line, so that the performance of the equipment is potentially susceptible to the unknown variations in the properties of the line.

The conventional practice to handle these variations has been to drive the line hard by means of a high gain operational amplifier and hope that the capacitance of the line (which typically may fall anywhere between 50 and 2500 picofarads) will not significantly distort the output signal (take the circuit's performance outside of spec.). The fundamental problem with this approach is the fact that the load, which may be typically represented as a parallel RC circuit coupled between the amplifier's output node and ground, effectively becomes part of the circuit and thereby affects the time constant properties (slew rate and rise/fall times) of the amplified driving signal.

SUMMARY OF THE INVENTION

In accordance with the present invention, the shortcomings of such a conventional digital line driver are effectively obviated by a predefinable slew rate driver circuit which employs load-monitoring feedback to maintain the slew rate of the driver circuit at a prescribed rate that is independent of the effective load of the line being driven. This load-monitoring feedback control makes it possible to drive the line with an amplified output signal that faithfully tracks the input signal and conforms with prescribed slew rate and rise/fall time specifications, irrespective of variable characteristics (such as capacitance) of the line.

Two embodiments of the invention are described. In a first, slew rate control is effected by adjusting (increasing or decreasing) the amount of charge on a storage device (such as a capacitor, variable threshold MOSFET, and the like, as non-limiting examples), and thereby the drive current to an output driver circuit, in accordance with the change in state of the output of an output terminal-monitoring voltage threshold comparator relative to the termination of a prescribed time window. In a second embodiment, slew rate control is effected by directly determining the length of time required for the output terminal to transition between first and second states thereof, and adjusting the operation of the output driver, in accordance with whether the total time measurement is greater than or less a prescribed slew rate window.

In the first embodiment of the invention, a controlled load/line driver device, such as a field effect transistor (FET), has its drain-source path coupled in circuit between an output terminal to which a (capacitive) load is coupled and a line driving supply rail. The drive control signal applied to the gate of the driver FET is supplied by way of a drive signal control FET. The drive signal control FET has its source-drain path coupled in circuit with an inverter, complementary FETs of which have their gates coupled to an input terminal, to which the driver switching signal is applied.

To reduce the power dissipation and control the shape of the load-driving output signal produced in the linear region of operation of the driver FET, a threshold-based gate drive control circuit is coupled in circuit with the gate of the output driver FET and the output terminal. This threshold based gate drive control circuit is operative to compare the gate voltage applied to the gate of the driver FET with its drain voltage applied to the output terminal. If the monitored gate-to-drain differential of the driver FET drops below a prescribed value (e.g., 0 volts), the drive control circuit rapidly pulls the gate of the driver FET to GND.

A charge storage device, such as a capacitor, is coupled to the gate of the drive signal control FET and is operative to store a charge that is used to establish the drive current for drive signal control FET, and thereby the magnitude of the drive control signal applied to the gate of the load-driving drive FET. The charge stored by the storage device (e.g., capacitor) is controllably adjustable by means of controlled charging and discharging circuit, the operation of which is controlled in accordance with the switching control signal applied to the input terminal and an error signal from an output terminal-monitoring circuit.

The controlled charging and discharging circuit is operative to adjustably increase or decrease the amount of stored charge, so that the rate at which the voltage at the output terminal switches between first and second states thereof satisfies a prescribed slew rate, as determined by the timing window of a monostable one-shot circuit, to which the input terminal is coupled. The controlled charging and discharging circuit may comprise a pair of complementary FETs, having their respective source-drain paths coupled in circuit between first and second voltage supply rails. A common connection of the drains of the FETs is coupled to the charge storage device, while their gates are coupled to logic circuitry which monitors the output terminal-monitoring circuit, the output a timing window monostable one-shot circuit and the switching control signal. The output terminal-monitoring circuit comprises a voltage threshold comparator having a first input coupled to a prescribed (Zener) voltage reference, a second input coupled to the output terminal, and an output terminal coupled to the controlled charging and discharging circuit.

In operation, in response to a switching control signal transition at the driver circuit's input terminal, the gate of the driver FET becomes coupled to the drain of the drive signal control FET, whose drain current is dependent upon the charge currently stored on the charge storage device. Since the rate of change of the drain voltage of the output driver FET (which is applied to the load) is dependent upon the capacitance of the load and the voltage on the gate of the driver FET, the larger the capacitance of the load, then the longer will be the charging/switching time and the larger the charge stored by the charge storage device. Conversely, for a smaller load capacitance, the shorter its charging/switching time and the lower the charge stored by the storage device.

In order to monitor the slew rate of the voltage at the output terminal, the time at which the voltage at the output terminal reaches a prescribed threshold is compared with the timing window of the one-shot. If the time at which the voltage at the output terminal reaches this threshold is within the timing window of the one-shot (i.e., sooner than the expiration of the timing window), then it is inferred that the drive current to the driver FET is too large, so that the charge by the charge storage device is reduced. On the other hand, if the time at which the voltage at the output terminal reaches the prescribed threshold is beyond the termination of the timing window of the one-shot (i.e., later than the expiration of the timing window), it is inferred that the drive current to the driver FET is too small and the charge by the storage device is increased.

In the second embodiment of the invention, slew rate control is made by directly determining the length of time required for the voltage at the output terminal to transition between first and second voltage levels, and adjusting the gate drive to the output driver FET in accordance with whether the total time measurement is greater than or less a prescribed slew rate window.

The drive control signal applied to the gate of the driver FET is supplied by way of a gate control circuit that is controlled in accordance with a pair of inputs. A first input corresponds to the switching control signal; a second input is coupled to the output of a count comparator. When the gate control circuit is enabled, it supplies a drive voltage to the gate of the output driver FET, so that output terminal is driven to a supply rail.

The output terminal to the load is coupled to first inputs of lower and upper reference level threshold comparators, second inputs of which are respectively coupled to receive a lower voltage reference and an upper voltage reference. The outputs of the threshold comparators are coupled to a clock signal gate circuit, which is also coupled to receive a clock signal. The output of the clock signal gate circuit is coupled to the clock input of a counter. The clock signal gate will pass clock pulses in response to an output signal from the lower reference threshold comparator indicating that its threshold voltage has been exceeded by the output voltage at the output terminal. The gate circuit becomes disabled in response to an output signal from the upper reference level threshold comparator indicating that its threshold voltage has been exceeded by the output voltage at the output terminal.

The clock signal counter has its enable input coupled to receive the switching control signal applied to the input terminal. When enabled by the switching control signal, the counter counts clock signals gated at the output of the clock signal gate circuit. The counter has its output coupled to a first input of the count comparator. A second input of the count comparator is coupled to receive a prescribed count value associated with the desired slew rate.

The output of the count comparator has one of two binary states, depending upon whether its count total is less than or equal to the prescribed count value. If the count total is less than or equal to the prescribed count value, the output of the comparator is effective to cause a prescribed reduction in the gate drive voltage output of gate control circuit. However, when the count total in counter exceeds the prescribed count value, the output of the comparator causes a prescribed increase in the gate drive voltage output of gate control circuit.

In operation, in response to a switching control signal, the driver FET drives the load in accordance with the magnitude of the gate voltage supplied by the gate control circuit. As the voltage at output terminal increases, it crosses the first threshold voltage of the lower threshold comparator, thereby enabling the clock signal gate circuit, so that the counter is incremented at a rate determined by the clock frequency of the clock signals. The drive voltage applied to the output terminal will eventually cross the second threshold voltage of the upper reference threshold comparator, thereby disabling the clock signal gate circuit, so that the counter stops counting clock signals.

If this count value is less than the reference count value, it is inferred the slew rate is faster than a prescribed value, causing the output of the comparator to have a binary state that reduces the gate drive output of gate control circuit. The effect of this decrease in gate voltage applied to the drive FET is to increase the time it takes for the voltage at the output terminal to transition between the voltage levels of the drive signal, so that more clock signals will be gated to the counter and bring its total closer to that of the prescribed count.

If the count total is greater than the reference count value, it is inferred the slew rate is slower than a prescribed value, causing the output of the count comparator to have a binary state that increases the gate drive output of the gate drive control circuit. This increase in the gate drive to the output driver FET effectively reduces the time it takes for the output voltage at the load terminal to transition between the voltage levels of the drive signal, so that fewer clock signals will be gated to the counter and thereby bring its total closer to that of the prescribed count.

DETAILED DESCRIPTION

Figure 1:
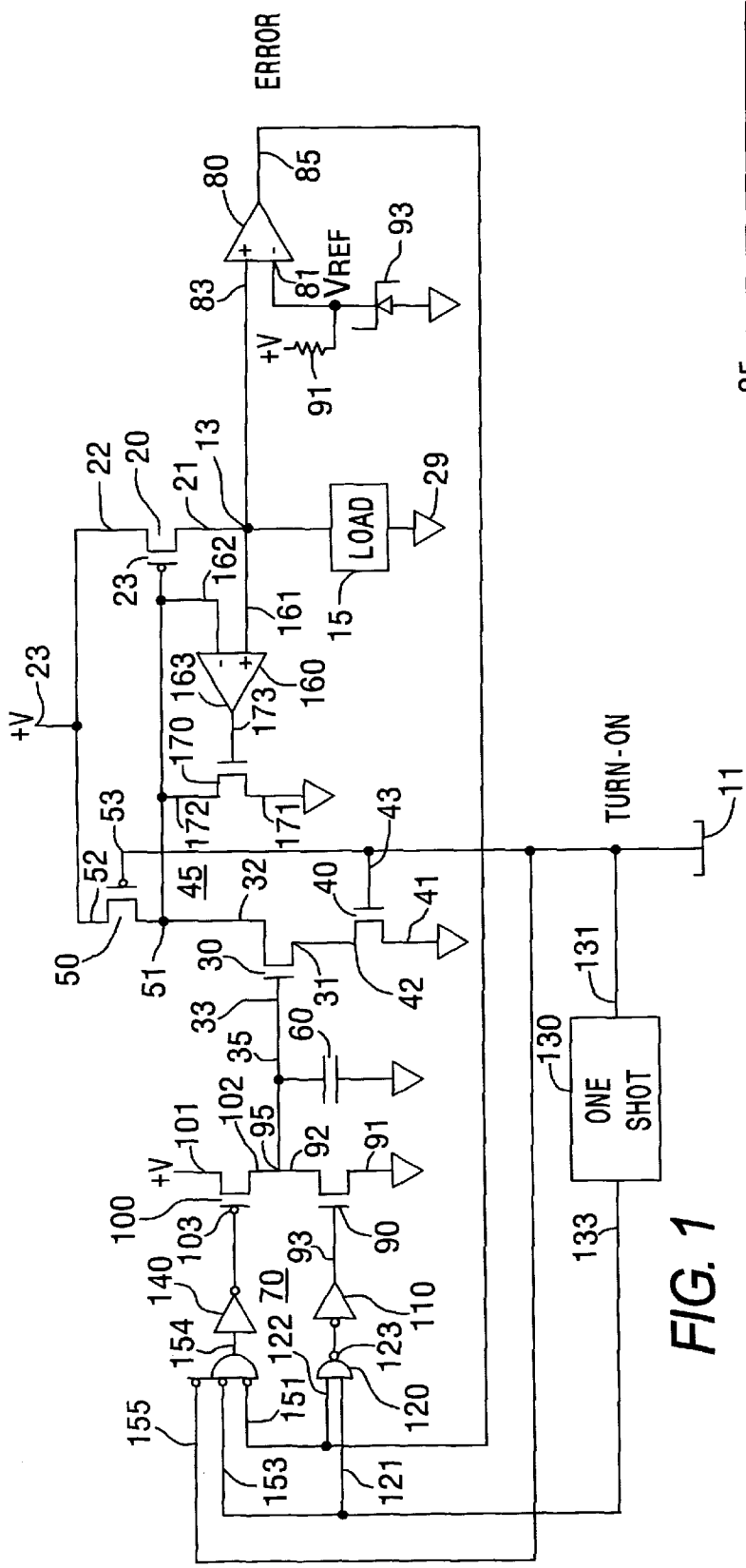
FIG. 1 diagrammatically illustrates a first embodiment of a load-independent, fixed switching rate driver circuit of the present invention.

A load-independent, fixed switching rate driver circuit in accordance with a first embodiment of the present invention is diagrammatically illustrated in FIG. 1 as comprising an input terminal 11 to which a switching control signal is applied, and an output terminal 13, which is coupled to a load 15 (such as but not limited to a capacitive load) that is to be switched between first and second electrical states (e.g., voltage levels). The drive signal for the output terminal 13 may be supplied by way of a controlled driver device which, in the illustrated embodiment, is shown as comprising a PMOS FET 20 for the non-limiting exemplary case of a positive-going switching control signal, shown at 25 in FIG. 2. FET 20 has its drain-source path 21–22 coupled in circuit between output terminal 13 and a positive voltage (+V) supply rail 27, with the load 15 being connected between output terminal 13 and a reference terminal (e.g., ground (GND)) 29.

The drive control signal applied to the gate 23 of FET 20 is supplied by way of a drive signal control NMOS FET 30, having its source-drain path 31–32 coupled in circuit with an NMOS FET 40 and a PMOS FET 50 of an inverter 45. NMOS FET 40 has its source 41 coupled to ground GND and its drain 42 coupled to the source 31 of NMOS FET 30, while PMOS FET 50 has its drain 51 coupled to the drain 32 of NMOS FET 30, and its source 52 coupled to the positive voltage (+V) supply rail 27. The respective gates 43 and 53 of FETs 40 and 50 are coupled to input terminal 11.

NMOS FET 30 has its gate 33 coupled to a driver circuit control node 35. A charge storage device, such as but not limited to a capacitor illustrate at 60, is coupled between control node 35 and ground, and is operative to store a charge that is used to establish the drive current for NMOS FET 30 and thereby the magnitude of the drive control signal applied to the gate 23 of load-driving drive PMOS FET 20. The charge stored on capacitor 60 is controllably adjustable by means of controlled charging and discharging circuit 70, the operation of which is controlled in accordance with the switching control signal applied to input terminal 11 and an error signal ERROR (shown at 26 in FIG. 2) that is derived by means of an output terminal-monitoring circuit 80. As will be described, controlled charging and discharging circuit 70 is operative to adjustably increase or decrease the amount of charge on capacitor 60, as necessary, so that the rate at which the voltage at output terminal 13 switches between first and second states thereof (e.g., GND and +V) satisfies a prescribed slew rate (as determined by the timing window of a monostable one-shot circuit 130, to which the input terminal 11 is coupled).

In the present embodiment, the output terminal-monitoring circuit 80 is shown as comprising a voltage threshold comparator. Voltage threshold comparator 80 has a first input 81 coupled to a prescribed voltage reference, shown as a voltage divider 166 comprised of a resistor 161 and a Zener diode 163 coupled in circuit between the positive voltage (+V) supply rail 27 and ground. Comparator 80 has a second input 83 coupled to the output terminal 13, and an output terminal 85 coupled to the controlled charging and discharging circuit 70.

The controlled charging and discharging circuit 70 is shown as comprising an NMOS FET 90 and a PMOS FET 100, having their respective source-drain paths 91–92 and 101–102 coupled in circuit between ground 29 and the (+V) voltage supply rail 27. The connection 95 between the drain 92 of NMOS FET 90 and the drain 102 of PMOS FET 100 is coupled to the control node 35. NMOS FET 90 has its gate 93 coupled through an inverter 110 to the output 123 of a NAND gate 120. NAND gate 120 has a first input 121 coupled to the output 133 of a timing window circuit, shown as a monostable one-shot circuit 130, having its input terminal 131 coupled to input terminal 11. NAND gate 120 has a second input 122 coupled to the output terminal 85 of the output terminal-monitoring circuit 80.

Figure 2:
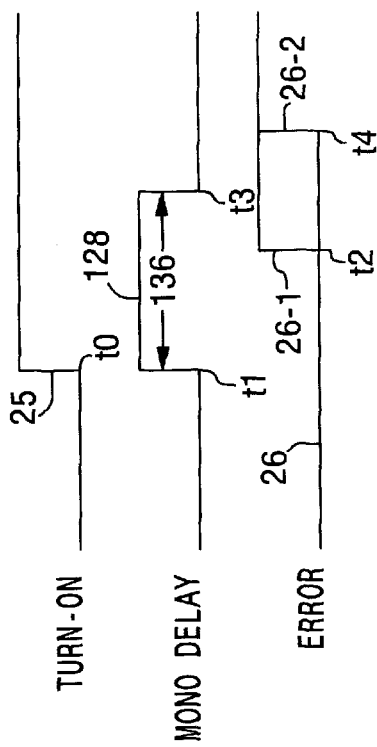
FIG. 2 is a timing diagram associated with the operation of FIG. 1.

As shown at 128 in FIG. 2, in response to the positive-going switching control signal 25 applied to input terminal 11, one-shot 130 is operative to change state (go high) for a prescribed period of time (timing window) 136, and then revert to its previous (stable-low) state. PMOS FET 100 has its gate 103 coupled through an inverter 140 to the output 154 of a NOR gate 150. NOR gate 150 has a first input 151 coupled to the output terminal 85 of the output terminal-monitoring circuit 80, and a second input 153 coupled to the output 133 of the timing window circuit 130, and a third input 155 coupled to the input terminal 11.

In order to reduce the power dissipation in and control the shape of the load-driving output signal produced in the linear region of operation of the driver PMOS FET 20 ($V_{GS}-V_T<V_{DS}$), a gate drive control circuit comprised of a further threshold comparator 160 and a control NMOS FET 170 is coupled in circuit with the gate 23 of PMOS FET 20 and the output terminal 13. In particular, threshold comparator 160 has a first input 161 coupled to the output terminal 13 and a second input 162 coupled to the gate 23 of driver FET 20. Threshold comparator 160 has an output 163 coupled to the gate 173 of NMOS FET 170, the source-drain path 171–172 of which is coupled between ground (GND) and the gate 23 of PMOS FET 20. Threshold comparator 160 is operative to compare the gate voltage applied to the gate 23 of driver FET 20 with its drain voltage applied to the output terminal 13. If the monitored gate-to-drain differential of driver PMOS FET 20 drops below a prescribed value (e.g., 0 volts), the output 163 of threshold comparator 160 changes state, turning on NMOS FET 170 and thereby rapidly pulling the gate 23 of driver PMOS FET 20 to GND.

OPERATION

It will initially be assumed that the output terminal 13 is stable at a first binary state-representative (e.g., low/GND) voltage level at the output terminal 13, as shown at 26 in FIG. 2. In this state, PMOS FET 50 of the inverter 45 is held turned ON, while NMOS FET 40 is held turned OFF by the low state of the voltage level at input terminal 11. With PMOS FET 50 held ON, driver PMOS FET 20 is held OFF and the output load voltage at the output terminal 13 is low.

At time t0, a positive-going switching control signal 25 is applied to input terminal 11, which switches the current state of inverter 45—turning off PMOS FET 50 and turning on NMOS FET 40. When NMOS FETs 30 and 40 turn on, the voltage at the gate 23 of driver PMOS FET 20 is determined by the current supplied by NMOS FETs 30 and 40 and the capacitance of node 51 (V=It/C). The current I is controlled by the size of NMOS FETs 30 and 40, +V and the voltage on capacitor 60, and the voltage on node 51 changes as a ramp. If a resistor is coupled from +V to node 51, then the gate drives become the voltage V=IR.

With PMOS FET 50 turned OFF and NMOS FET 40 turned ON, the voltage level at the gate 23 of driver PMOS FET 20 will now be determined by the voltage at the drain 32 of drive signal control NMOS FET 30. This voltage, in turn, is dependent upon the charge currently stored on capacitor 60. As a consequence, the rate at which the drain voltage of output driver PMOS FET 20 (which is applied to the load terminal 13) rises toward the positive rail voltage (+V) will be dependent upon the charge stored on capacitor 60. This voltage, in turn, depends upon the capacitance of the load 15. The larger the capacitance of the load, the longer its charging/switching time and the larger charge stored on capacitor 60; the smaller the capacitance of the load, the shorter its charging/switching time and the lower charge stored on capacitor 60.

In order to monitor the slew rate of the voltage at the output terminal 13, the time at which the voltage at the output terminal reaches a prescribed threshold (as set by the threshold of the output terminal-monitoring circuit 80) is compared with the timing window of one-shot 130. If, as shown by rising edge 26-1 of the error signal ERROR in FIG. 2, the time t2 at which the voltage at the output terminal 13 reaches this prescribed threshold is within the timing window t1–t3 of one-shot 130 (i.e., sooner than the expiration of the timing window), then it is inferred that the drive current to PMOS FET 20 is too large; thus, the charge on capacitor 60 must be reduced. In this case, the inputs to NOR gate 150 cause PMOS FET 100 to be turned OFF, while the inputs to NAND gate 120 cause NMOS FET 90 to turn ON. Therefore, charge on capacitor 60 is dissipated through turned-on FET 90, until one-shot 130 changes state at time t3.

Conversely, if as shown by rising edge 26-2 of the error signal ERROR in FIG. 2, the time t4 at which the voltage at the output terminal 13 reaches the prescribed threshold is beyond the termination of the timing window t1–t3 of one-shot 130 (i.e., later than the expiration of the timing window), then it is inferred that the drive current to PMOS FET 20 is too small and the charge on capacitor 60 must be increased. In this case, the inputs to NOR gate 150 cause PMOS FET 100 to be turned ON, while the inputs to NAND gate 120 cause NMOS FET 120 to be turned OFF. As a consequence, capacitor 60 is charged through turned-on FET 100 until the error voltage at the output terminal 85 of the output terminal-monitoring circuit 80 changes state at time t4.

As described above, in the embodiment of FIG. 1, the output driver has been shown as comprising a PMOS FET 20 for the non-limiting exemplary case of positive-going signals. For negative-going signals, a similar, complementary polarity circuit may be employed, with the output driver comprising an NMOS device coupled to GND. The remainder of the circuit may also use complementary polarity components (PMOS for NMOS, and NMOS for PMOS), as well as complementary voltage rails (+V for GND, and GND for +V). It is also to be understood that the series order for NMOS transistors 30 and 40 can be interchanged.

In the foregoing embodiment of FIG. 1, slew rate adjustment is effected by increasing or decreasing the amount of charge on a reference capacitor and thereby the drive current, in accordance with when the output of an output terminal-monitoring voltage threshold comparator changes state relative to the termination of a prescribed (one-shot established) time window. Pursuant to a second embodiment of the invention, this slew rate determination is made by directly determining the length of time required for the output terminal to transition between first and second states, and adjusting the drive in accordance with whether the total time measurement is greater than or less a prescribed slew rate window.

Figure 3:
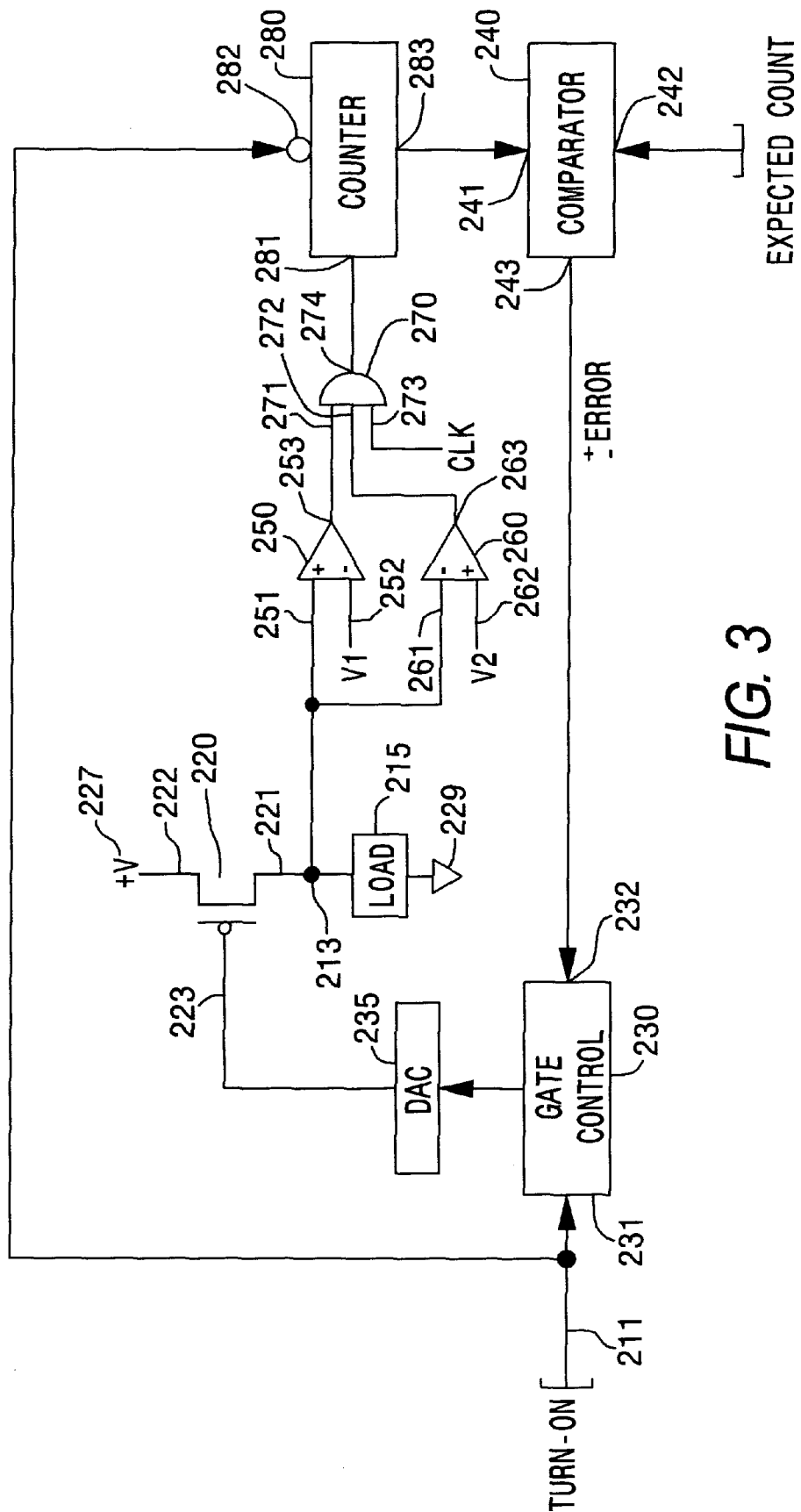
FIG. 3 diagrammatically illustrates a second embodiment of the driver circuit of the present invention.

For this purpose, the second embodiment of a load-independent, fixed switching rate driver circuit is diagrammatically illustrated in FIG. 3 as comprising an input terminal 211 to which a switching control signal is applied, and an output terminal 213, which is coupled to a load 215 that is to be switched between first and second electrical states. As in the first embodiment, the drive signal for the output terminal 213 may be supplied by way of a controlled driver device, such as a PMOS FET 220 for the non-limiting exemplary case of a positive-going switching control signal. PMOS FET 220 has its drain-source path 221–222 coupled in circuit between output terminal 213 and a positive voltage (+V) supply rail 227, with the load 215 being connected between output terminal 213 and a reference terminal (GND) 229.

The drive control signal applied to the gate 223 of driver PMOS FET 220 is supplied by way of a gate control circuit 230, that is controlled in accordance with a pair of inputs: a first input 231 corresponding to the switching control signal, and a second input 232 coupled to the output 243 of a count comparator 240. When gate circuit 230 is enabled it supplies a drive voltage (via a digital-to-analog converter DAC 235) to the gate 223 of driver FET 220, so that output terminal 213 is driven to the supply rail (+V).

The output terminal 213 is coupled to first inputs 251 and 261 of respective lower and upper reference level threshold comparators 250 and 260, second inputs 252 and 262 of which are coupled to receive a lower voltage reference (V1) and an upper voltage reference (V2). The respective outputs 253 and 263 of threshold comparators 250 and 260 are coupled to first and second control inputs 271 and 272 of a gate circuit 270, a third input 273 of which is coupled to receive a clock signal. Gate circuit 270 has an output 274 coupled to the clock input 281 of a counter 280. Gate circuit 270 is enabled to pass clock pulses in response to an output signal from threshold comparator 250 indicating that its threshold voltage V1 has been exceeded by the output voltage at output terminal 221. Gate circuit 270 is disabled in response to an output signal from threshold comparator 260 indicating that its threshold voltage V2 has been exceeded by the output voltage at output terminal 221.

Counter 280 has its enable input 282 coupled to receive the switching control signal applied to input terminal 211. When enabled by the switching control signal, counter 280 counts clock signals gated at the output of gate circuit 270. Counter 280 has its output 283 coupled to a first input 241 of count comparator 240. A second input 242 of count comparator 240 is coupled to receive a prescribed count value associated with the desired slew rate. The output 243 of count comparator 240 has one of three binary values, depending upon whether the count total in counter 280 is less than, greater than or equal to the prescribed count value supplied to input 242.

If the count total in counter 280 is less than the prescribed count value, the output of comparator 240 has a first prescribed binary value (e.g., '00') that is effective to cause a prescribed reduction in the gate drive voltage output of gate control circuit 230. If, however, the count total in counter 280 exceeds the prescribed count value, the output of comparator 240 has a second prescribed binary value (e.g., '01') that causes a prescribed increase in the gate drive voltage output of gate control circuit 230. If the values are equal, then the gate drive voltage is unchanged.

OPERATIONS

In operation, in response to a switching control signal applied to input terminal 211, driver FET 220 drives the load 215 in accordance with the magnitude of the gate voltage supplied by gate control circuit 230. (When the turn on signal goes low, the gate control circuit 230 is disabled, turning off the gate drive to drive FET 220. In addition, the clock signal counter is cleared or reset.) As the voltage at output terminal 213 begins to increase, it crosses the first threshold voltage (V1) of lower threshold comparator 250, thereby enabling the gate circuit 270, so that counter 280 is incremented at a rate determined by the clock frequency of the clock signals.

Eventually the drive voltage applied to output terminal 213 will cross the second threshold voltage (V2) of upper threshold comparator 260, thereby disabling the gate circuit 270, so that counter 280 stops counting clock signals. If this count value is less than the reference count value, it is inferred the slew rate is faster than a prescribed value, causing the output of comparator 240 to have a binary state that reduces the gate drive output of gate control circuit 230. The effect of this decrease in gate drive to drive FET 220 is to increase the time it takes for the output voltage at terminal 213 to transition between voltage values V1 and V2, so that more clock signals will be gated to counter 280 and bring its total closer to that of the prescribed count. If the count is correct, no adjustment is made.

On the other hand, if the count total is greater than the reference count value, it is inferred the slew rate is slower than a prescribed value, causing the output of comparator 240 to have a binary state that increases the gate drive output of gate control circuit 230. This increase in the gate drive to drive FET 220 effectively reduces the time it takes for the output voltage at terminal 213 to transition between voltage values V1 and V2, so that fewer clock signals will be gated to counter 280 and thereby bring its total closer to that of the prescribed count.

As will be appreciated from the foregoing description, the shortcomings of a conventional digital line driver are effectively obviated by employing load-monitoring feedback to maintain the slew rate of the driver circuit at a prescribed rate that is independent of the effective load of the line being driven. This load-monitoring feedback control makes it possible to drive the line with an amplified output signal that faithfully tracks the input signal and conforms with prescribed slew rate and rise/fall time specifications, irrespective of the capacitance of the line.

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. A circuit for driving a load comprising:
   an input terminal to which an input signal that transitions between respectively different input signal states is applied;
   an output terminal that is to be driven by a drive signal that transitions between respectively different output signal states in accordance with said transitions of said input signal;
   a driver circuit, which is operative to drive said load with said output signal in accordance with said input signal; and
   a control circuit which includes a charge storage device and is operative to controllably increase or decrease the amount of charge stored by said charge storage device and thereby drive to said driver circuit, based upon the duration of a transition in said output signal between first and second levels thereof relative to a prescribed time window associated with said transition in said input signal.

2. A circuit for driving a load comprising:
   an input terminal to which an input signal that transitions between respectively different input signal states is applied;
   an output terminal that is to be driven by a drive signal that transitions between respectively different output signal states in accordance with said transitions of said input signal;
   a driver circuit, which is operative to drive said load with said output signal in accordance with said input signal; and
   a control circuit which is operative to monitor a characteristic of said load and, in response to a transition in said input signal, is operative to control drive to said driver circuit in accordance with time required for said output terminal to transition between first and second output signal levels; and
   wherein said driver circuit includes
      a controlled switching device having an output signal path coupled in circuit with said output terminal, and a control terminal therefor coupled to a drive signal control device, said drive signal control device having its current flow path coupled in circuit with an inverter to which said input signal is applied, and a control terminal therefor coupled to said control circuit, and
      a threshold-based drive control circuit coupled in circuit with said output terminal and said control terminal of said controlled switching device, and being operative to affect the operation of said controlled switching device in accordance with a prescribed relationship between the voltage at said output terminal and the voltage applied to the control terminal of said controlled switching device.

3. A circuit for driving a load comprising:
   an input terminal to which an input signal that transitions between respectively different input signal states is applied;
   an output terminal that is to be driven by a drive signal that transitions between respectively different output signal states in accordance with said transitions of said input signal;
   a driver circuit, which is operative to drive said load with said output signal in accordance with said input signal; and
   a control circuit which is operative to monitor a characteristic of said load and, in response to a transition in said input signal, is operative to control drive to said driver circuit in accordance with time required for said output terminal to transition between first and second output signal levels; and
   wherein said driver circuit includes a controlled switching device having an output signal path coupled in circuit with said output terminal, and a control terminal therefor coupled to a drive signal control device, said drive signal control device having its current flow path coupled in circuit with an inverter to which said input signal is applied, and a control terminal therefor coupled to said control circuit; and wherein
   said control circuit includes a charge storage device and is operative to controllably increase or decrease the amount of charge stored by said charge storage device and thereby control the drive to said drive signal control device in accordance with the duration of said transition in said output signal between said first and second output levels thereof relative to a prescribed time window associated with said transition in said input signal.

4. A circuit according to claim 1, wherein control circuit includes a controlled charging and discharging circuit, which is operative to controllably increase and decrease charged stored by said charge storage device in accordance with the duration of said transition in said output signal between said first and second output levels thereof relative to a prescribed time window associated with said transition in said input signal.

5. A circuit according to claim 4, wherein said control circuit includes a comparator circuit coupled to compare the state of said output signal with a threshold and is operative to supply a signal to said controlled charging and discharging circuit in response to said output signal exceeding said threshold.

6. A circuit according to claim 4, wherein said controlled charging and discharging circuit is operative to adjustably increase or decrease the amount of charge by said charge storage device, so that the rate at which said output signal at said terminal switches between first and second states thereof satisfies a prescribed slew rate associated with said length of time, as determined by a timing circuit coupled to said input terminal.

7. For use with a circuit for driving a load, said circuit including an input terminal to which an input signal that transitions between respectively different input signal levels is applied, an output terminal that is to be driven by an output signal that transitions between respectively different output signal levels in accordance with said transitions of said input signal, and a driver circuit, which is operative to drive said load with said output signal in accordance with said input signal, a method of controlling the operation of said driver circuit comprising the steps of:

(a) monitoring a characteristic of said output signal; and
(b) in response to a transition in said input signal and said output exceeding a threshold, controllably adjusting the amount of charge stored by a charge storage device, and thereby drive to said driver circuit, in accordance with the duration of a transition in said output signal between said first and second output signal levels thereof relative to a prescribed time window associated with a transition in said input signal.

* * * * *